United States Patent
Kang et al.

(10) Patent No.: US 7,755,909 B2
(45) Date of Patent: Jul. 13, 2010

(54) SLIM DESIGN MAIN BOARD

(75) Inventors: Seok-Myong Kang, Hwaseong-si (KR); Hong-Kweun Kim, Ansan-si (KR); June-Hyeon Ahn, Suwon-si (KR); Ki-Hyun Kim, Suwon-si (KR); Youn-Ho Choi, Suwon-si (KR)

(73) Assignee: Samsung Electronics Co., Ltd., Yeongtong-Gu, Suwon-si, Gyeonggi-Do (KR)

( * ) Notice: Subject to any disclaimer, the term of this patent is extended or adjusted under 35 U.S.C. 154(b) by 124 days.

(21) Appl. No.: 11/944,650

(22) Filed: Nov. 26, 2007

(65) Prior Publication Data

US 2008/0123309 A1    May 29, 2008

(30) Foreign Application Priority Data

Nov. 27, 2006    (KR) ...................... 10-2006-0117902

(51) Int. Cl.
*H05K 1/18*    (2006.01)

(52) U.S. Cl. .................. 361/764; 361/760; 361/795; 174/260; 174/261

(58) Field of Classification Search .................. 361/764, 361/760, 795; 174/260–261
See application file for complete search history.

(56) References Cited

U.S. PATENT DOCUMENTS

| 5,594,626 | A | * | 1/1997 | Rostoker et al. | ............. 361/784 |
| 5,689,091 | A |   | 11/1997 | Hamzehdoost et al. | ...... 174/255 |
| 6,940,182 | B2 | * | 9/2005 | Hilton et al. | ................. 257/787 |
| 2003/0164550 | A1 | * | 9/2003 | Lee et al. | .................... 257/777 |

* cited by examiner

*Primary Examiner*—Hung S Bui
*Assistant Examiner*—Andargie M Aychillhum
(74) *Attorney, Agent, or Firm*—Cha & Reiter, LLC

(57) ABSTRACT

A main board suitable for slim configurations is disclosed. The main board includes a multi-layer Printed Circuit Board (PCB) in which at least one recess is formed, a first integrated circuit placed in the recess, and a molding that covers the first integrated circuit and the bottom of the recess. The main board further comprising a cover over said recess, said cover being a second integrated circuit or a second PC board, which may further having attached an integrated circuit positioned within the recess.

7 Claims, 6 Drawing Sheets

SLIM DESIGN MAIN BOARD

CLAIM OF PRIORITY

This application claims the benefit of the earlier filing date, under 35 U.S.C. §119(a), to that patent application filed in the Korean Intellectual Property Office on Nov. 27, 2006 and assigned Serial No. 2006-117902, the entire disclosure of which is hereby incorporated by reference.

BACKGROUND OF THE INVENTION

1. Field of the Invention

The present invention relates to PC board fabrication, and in particular, to a PC board in which a plurality of electronic devices and integrated circuits are integrated on a multi-layer Printed Circuit Board (PCB).

2. Description of the Related Art

A multi-layer Printed Circuit Board (PCB) has a structure in which a plurality of insulation layers and a plurality of conductive pattern layers are deposited in turn, and is used as a main board having a plurality of electronic devices and integrated circuits integrated thereon for notebooks, portable wireless terminals, and the like that require high-density integration.

FIG. 1 is a cross-sectional view of a conventional main board 100. Referring to FIG. 1, the main board 100 includes a multi-layer PCB 110 in which a plurality of insulation layers and a plurality of conductive pattern layers are deposited in turn and integrated circuits 121, 122, and 123 are placed on the PCB 110. In addition to the integrated circuits 121, 122, and 123, a plurality of electronic devices may also be integrated on the main board 100.

The integrated circuits 121, 122, and 123 may be in a form in which a semiconductor die, an interposer, or the like is repetitively deposited as a multi-layer structure. The integrated circuits 121, 122, and 123 may be connected to some of the conductive pattern layers on the PCB 110 by a wire. A molding 130 may be formed on the PCB 110 on which the integrated circuits 121, 122, and 123 are placed.

However, since the molding 130 of the main board 100 is formed in a state where the integrated circuits 121, 122, and 123 are disposed on the PCB 110, the main board 100 thickness makes it difficult to apply main board 100 to slim portable wireless communication terminals or portable digital devices.

SUMMARY OF THE INVENTION

An aspect of the present invention is to address at least the above problems and/or disadvantages. Accordingly, an aspect of the present invention is to provide a main board capable of providing multi-function and multi-integration capabilities with a slim thickness.

According to one aspect of the present invention, there is provided a main board. The main board includes a multi-layer Printed Circuit Board (PCB) in which at least one recess is formed, a first integrated circuit placed in the recess, and a molding that covers the first integrated circuit and the bottom of the recess.

According to another aspect of the present invention, there is provided a main board. The main board includes a multi-layer Printed Circuit Board (PCB) in which at least one recess is formed, a first integrated circuit and a second integrated circuit placed in the recess in a form in which they are deposited above and below with respect to each other, a molding that covers the first integrated circuit, the second integrated circuit, and the bottom of the recess, at least one electronic device integrated on the multi-layer PCB, and a third integrated circuit placed on the multi-layer PCB to cover the top of the recess.

BRIEF DESCRIPTION OF THE DRAWINGS

The above and other features and advantages of exemplary embodiments of the present invention will be more apparent from the following detailed description taken in conjunction with the accompanying drawings, in which.

Throughout the drawings, the same drawing reference numerals will be understood to refer to the same elements, features and structures.

DETAILED DESCRIPTION OF THE INVENTION

Figure 1:
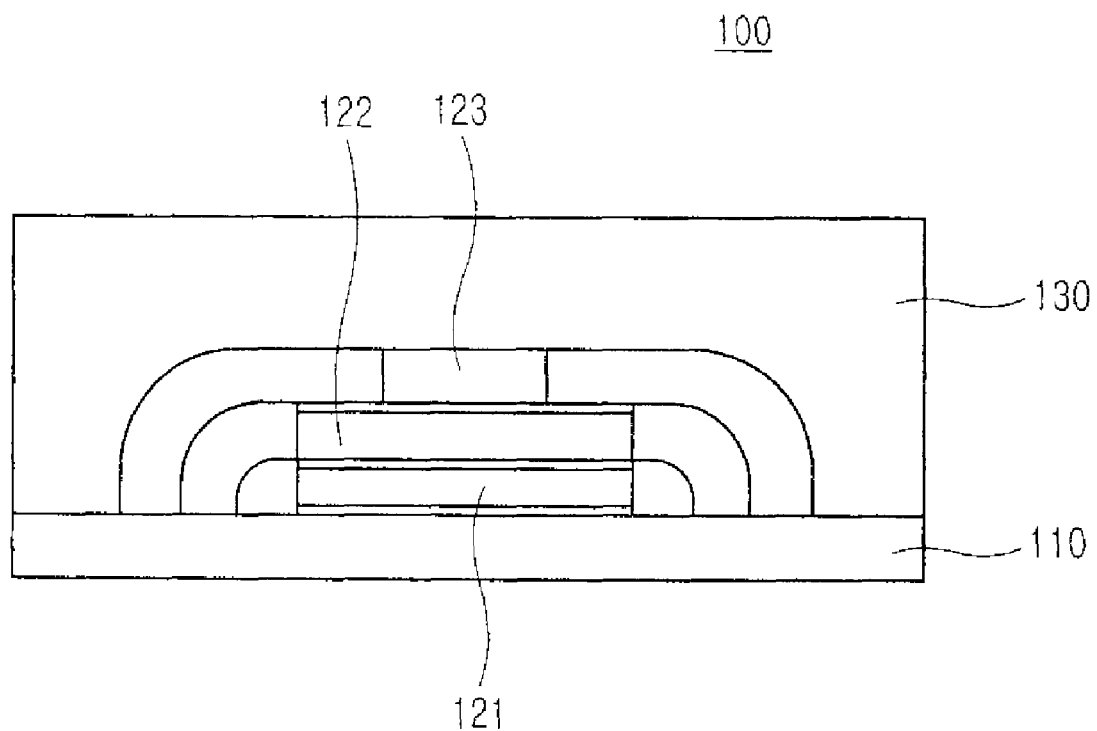
FIG. 1 is a cross-sectional view of a conventional main board.

The matters defined in the description such as a detailed construction and elements are provided to assist in a comprehensive understanding of exemplary embodiments of the invention. Accordingly, those of ordinary skill in the art will recognize that various changes and modifications of the embodiment described herein can be made without departing from the scope and spirit of the invention. Also, descriptions of well-known functions and constructions are omitted for clarity and conciseness.

FIGS. 2A through 2F are cross-sectional views showing steps of manufacturing a main board according to a first exemplary embodiment of the present invention. FIG. 2G is a cross-sectional view of the main board manufactured by the steps illustrated in FIGS. 2A through 2F.

Referring to FIGS. 2A through 2G, the main board according to the first exemplary embodiment of the present invention includes a multi-layer Printed Circuit Board (PCB) 210 in which at least one recess 210a is formed, a first integrated circuit 220 placed in the recess 210a (FIG. 2B), a first interposer 230 (FIG. 2C), a second interposer 240 (FIG. 2D), a molding 250 (FIG. 2E) that covers the first integrated circuit 220, the first interposer 230, the second interposer 240, and the bottom of the recess 210a, electronic devices 320, and a second integrated circuit 310 (FIG. 2G) placed on the multi-layer PCB 210 to cover the top of the recess 210a.

Figure 2A:
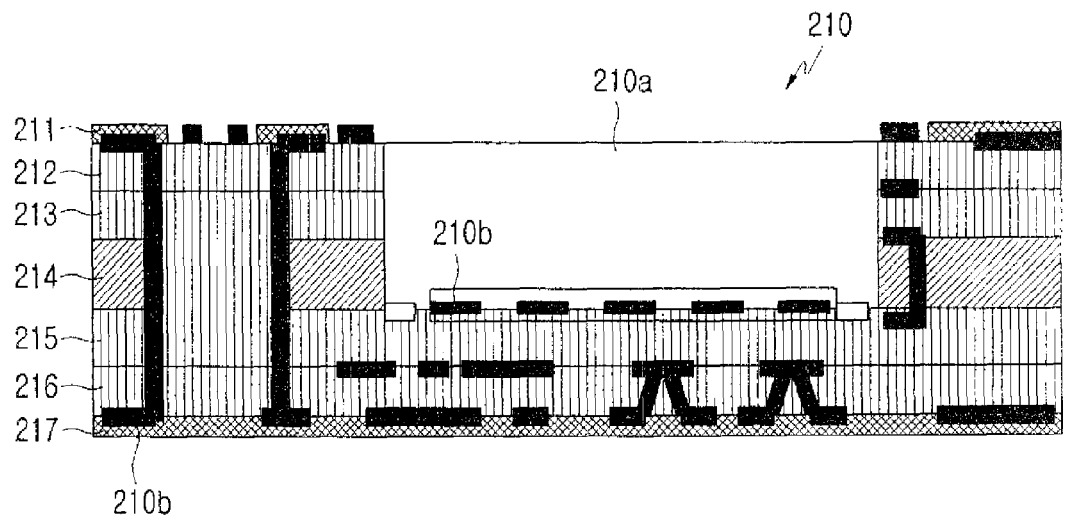
FIGS. 2A through 2G are cross-sectional views showing steps of manufacturing a main board according to a first exemplary embodiment of the present invention.
Figure 2B:
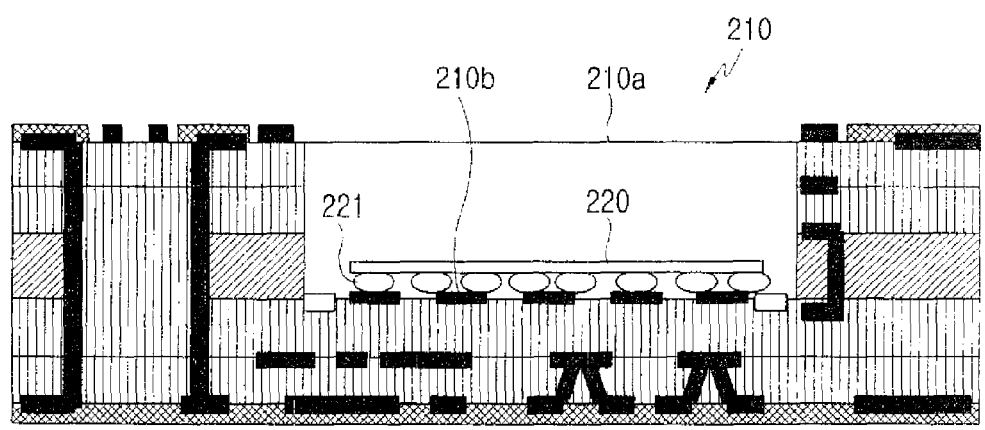
Figure 2C:
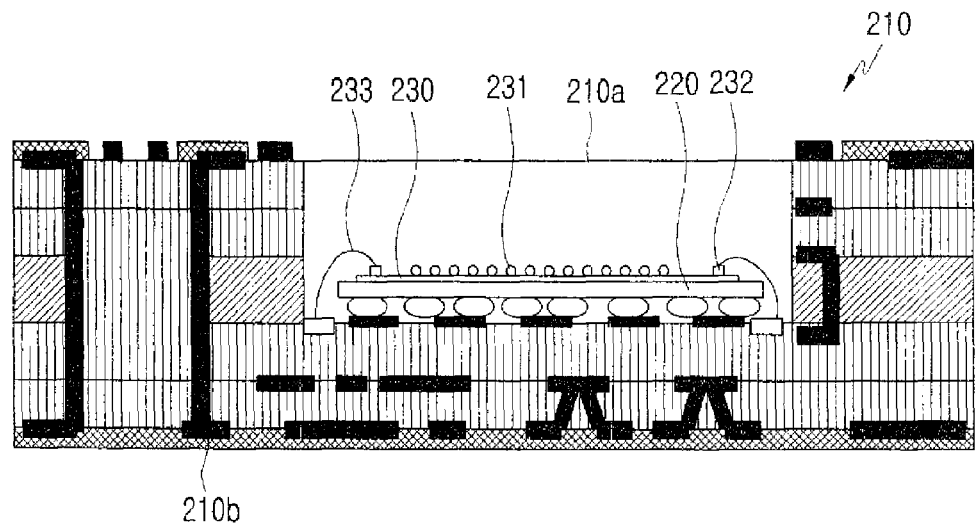
Figure 2D:
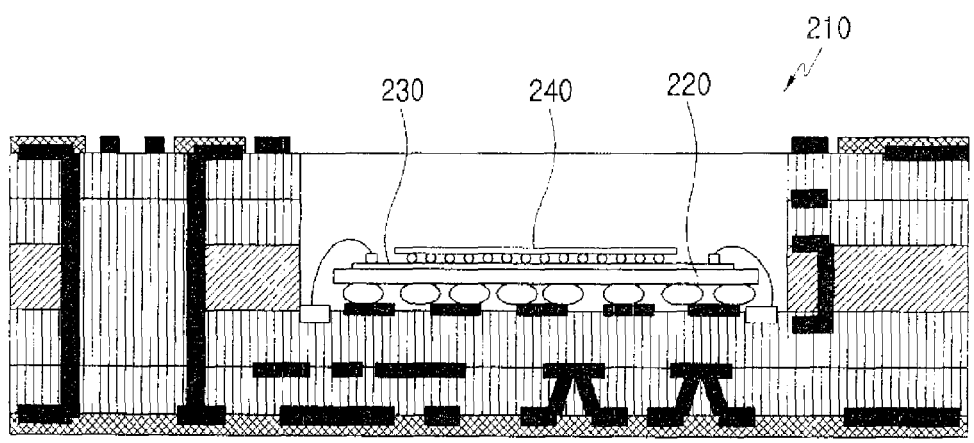
Figure 2E:
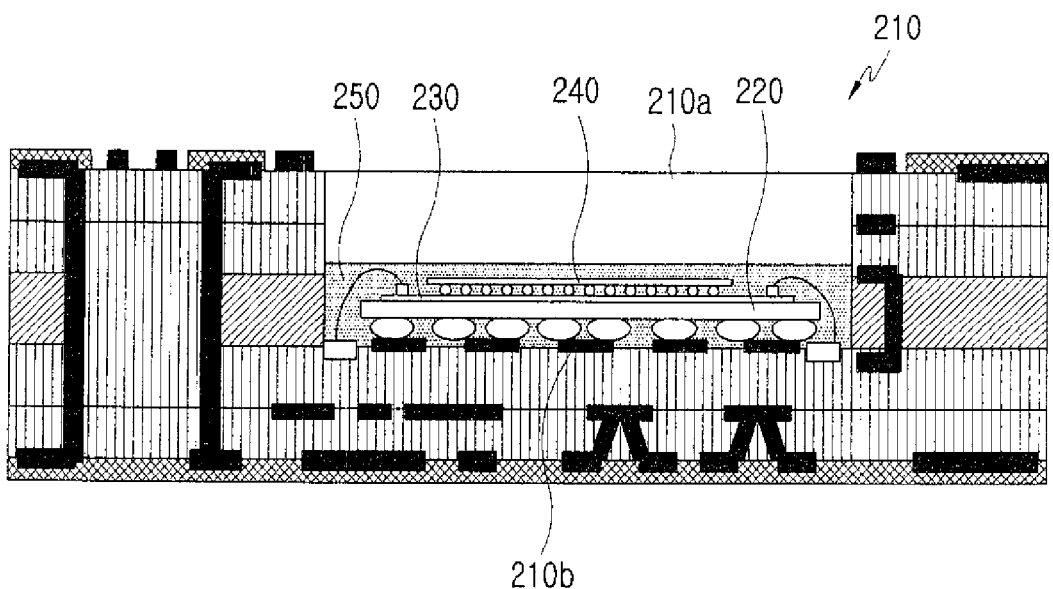

As illustrated in FIG. 2A, the multi-layer PCB 210 includes deposited first through seventh insulation layers 211, 212, 213, 214, 215, 216, and 217, conductive circuit pattern layers 210b formed between the insulation layers 211, 212, 213, 214, 215, 216, and 217, and the recess 210a is formed by removing some of the insulation layers 211 through 217 using etching. The conductive circuit pattern layer may be formed by etching a conductive material such as copper (Cu) deposited between the insulation layers 211 through 217 or by forming via channels passing through the insulation layers 211 through 217 and then filling the channels with a conductive filler The conductive circuit pattern layer 210b formed in the bottom of the recess 210a may be provided as a land for electric connection with the first integrated circuit 220. As illustrated in FIG. 2B, the first integrated circuit 220 is connected with the conductive circuit pattern layer 210b formed in the bottom of the recess by a solder ball 221 inserted between the conductive circuit pattern layer 210b and the first integrated circuit 220. As illustrated in FIGS. 2C and 2D, a first interposer 230 and the second interposer 240 are sequentially placed on the first integrated circuit 220. The first integrated circuit 220, the first interposer 230, and the second interposer 240 are electrically connected by a flip chip method using a flux dipping unit or by a reflow process. As illustrated in FIG. 2E, molding 250 is formed in the recess 210a to bury the first integrated circuit 220, the first interposer 230, and the second interposer 240. An epoxy molding compound for shielding electromagnetic waves may be used as the molding 250. The molding 250 is formed in such a way that its height is smaller than the depth of the recess 210a, thereby minimizing the thickness of the main board 200 when the main board 200 is combined with external other devices.

Figure 2F:
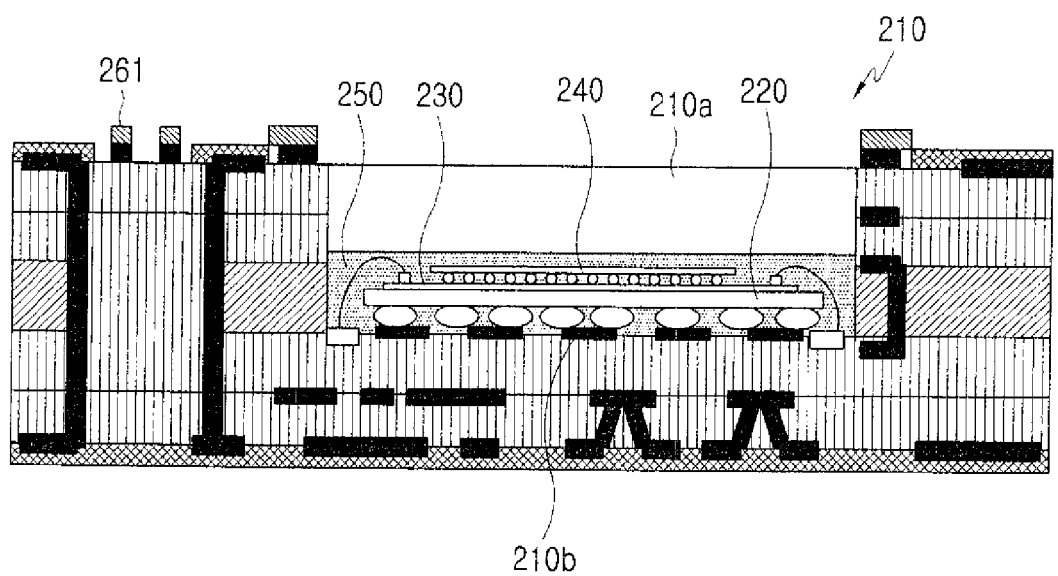
Figure 2G:
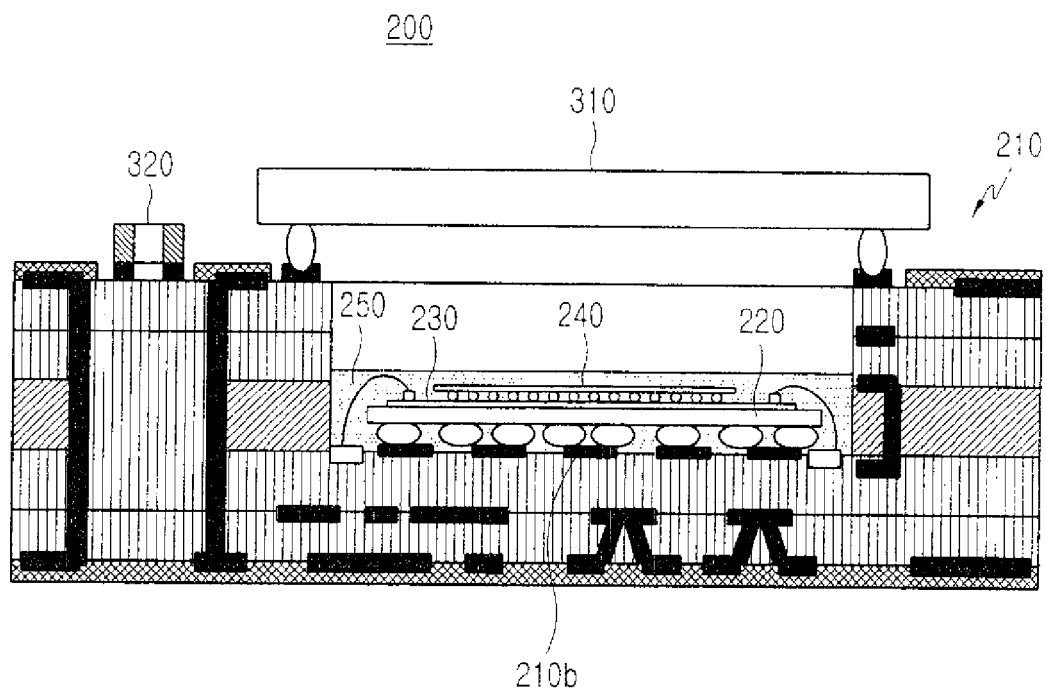

In FIG. 2F, a pad 261, electrically connected to one of the conductive circuit pattern layers 210b, which is exposed on the multi-layer PCB 210, is formed for electric connection between the electronic device 320 and the second integrated circuit 310. As illustrated in FIG. 2G; the electronic device 320 and the second integrated circuit 310 can be placed on the multi-layer PCB 210 by means of the pad 261.

Figure 3:
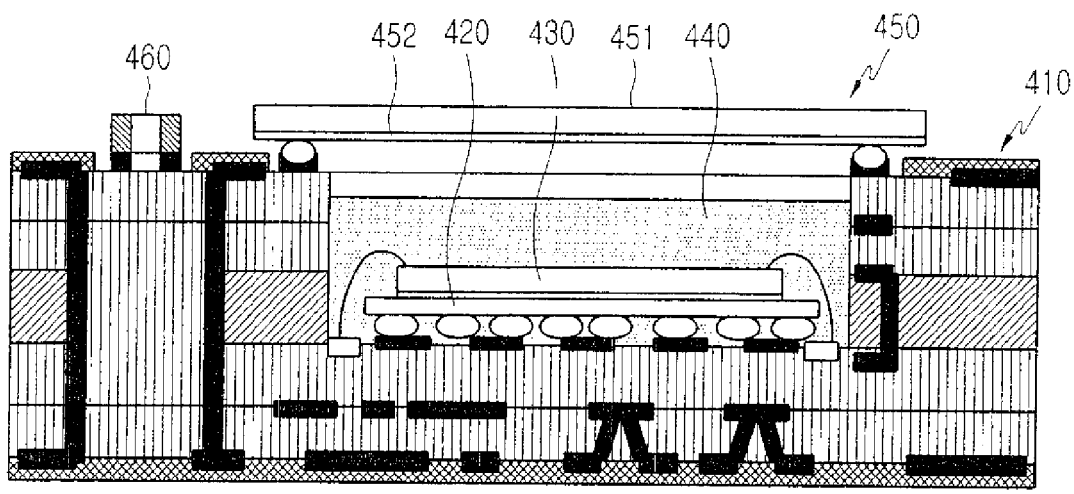
FIG. 3 is a cross-sectional view of a main board according to a second exemplary embodiment of the present invention.

FIG. 3 is a cross-sectional view of a main board 400 according to a second exemplary embodiment of the present invention. Referring to FIG. 3, the main board 400 includes a multi-layer PCB 410 in which at least one recess is formed, a first integrated circuit 420 and a second integrated circuit 430 placed in the recess in a form in which they are deposited above and below with respect to each other, a molding 440 that covers the first integrated circuit 420, the second integrated circuit 430, and the bottom of the recess, at least one electronic device 460 integrated on the multi-layer PCB 410, and a third integrated circuit 450 placed on the multi-layer PCB 410 to cover the top of the recess.

The multi-layer PCB 410 includes at least one insulation layers and conductive circuit pattern layers formed between or via the insulation layers. The first integrated circuit 420 and the second integrated circuit 430 are vertically deposited and may be in a form in which at least three integrated circuits are deposited.

Figure 4:
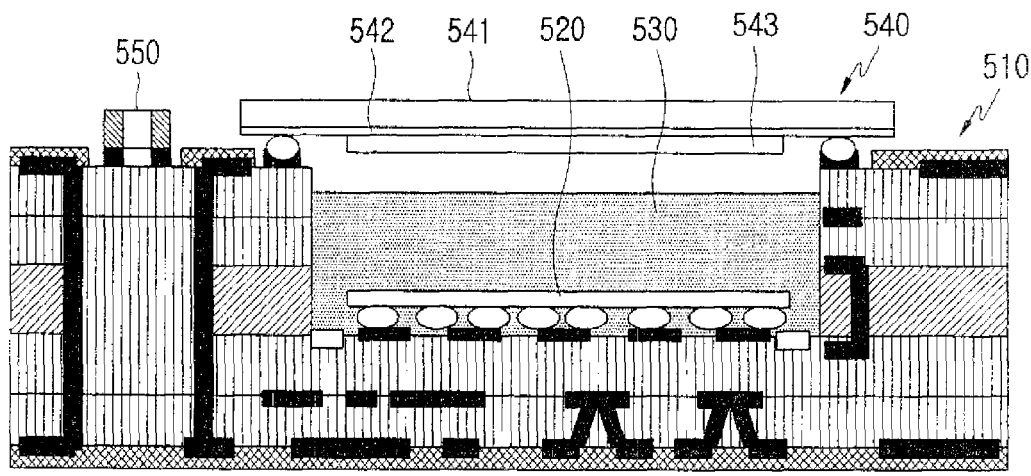
FIG. 4 is a cross-sectional view of a main board according to a third exemplary embodiment of the present invention.

FIG. 4 is a cross-sectional view of a main board 500 according to a third exemplary embodiment of the present invention. Referring to FIG. 4, the main board 500 includes a first PCB 510 in which at least one recess is formed, at least one first integrated circuit 520 placed in the recess, a molding 530 that covers the first integrated circuit 520 and the bottom of the recess, at least one electronic device 550 integrated on the first PCB 510, and a second PCB 540 placed on the first PCB 510 to cover the top of the recess.

A second integrated circuit 543 is placed on a surface of the second PCB 540 that which faces the molding 530, and the second PCB 540 may include a substrate 541 and a conductive circuit pattern layer 542 formed between the substrate 541 and the second integrated circuit 543.

Figure 5:
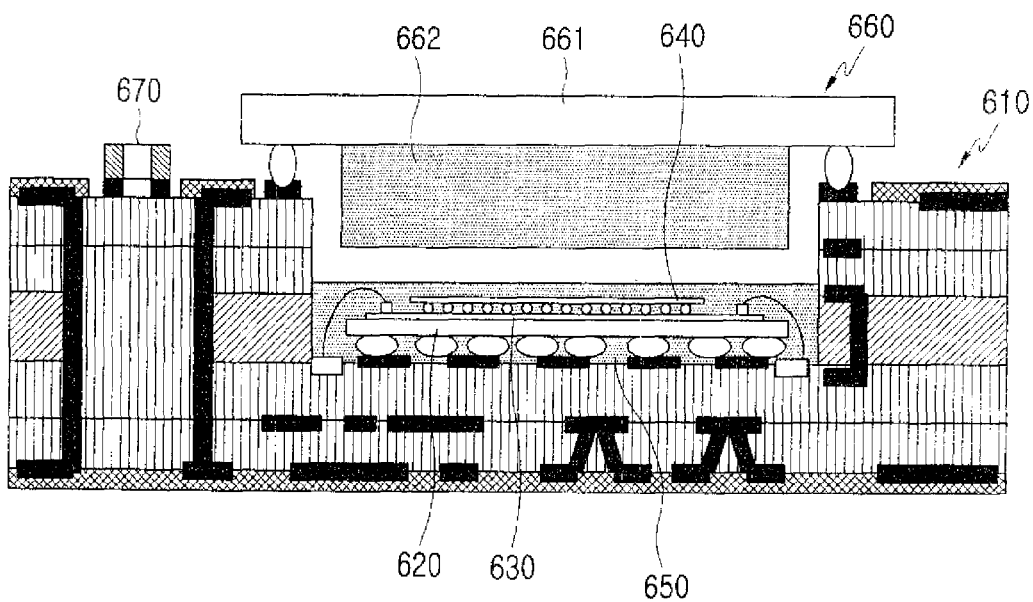
FIG. 5 is a cross-sectional view of a main board according to a fourth exemplary embodiment of the present invention.

FIG. 5 is a cross-sectional view of a main board 600 according to a fourth exemplary embodiment of the present invention. Referring to FIG. 5, the main board 600 includes a first PCB 610 in which at least one recess is formed, at least one integrated circuit 620 placed in the recess, a first interposer 630 and a second interposer 640 placed on the integrated circuit 620, a first molding 650 formed in the recess to bury the integrated circuit 620, the first interposer 630, and the second interposer 640, at least one electronic device 670 integrated on the first PCB 610, and a second PCB 660 placed on the first PCB 610 to cover the top of the recess and having a second molding 662 facing the first molding 610.

The second PCB 660 includes a substrate 661 and may have at least one electronic device or Radio Frequency (RF) device placed on a surface of the substrate 661, which faces the first molding 650. The second molding 662 may be formed to surround the at least one electronic device or RE device.

In the main board having a plurality of electronic parts and integrated circuits integrated thereon according to the present invention, the integrated circuits are mounted in the recess of the PCB. Therefore, the main board can be easily applied to slim portable wireless communication terminals or portable electronic devices. In other words, the present invention can offer the main board capable of providing multi-function and multi-integration capabilities with a slim thickness, thereby reducing the unit cost of the main board.

While the invention has been shown and described with reference to exemplary embodiments thereof, it will be understood by those skilled in the art that various changes in form and details may be made therein without departing from the spirit and scope of the invention.

What is claimed is:

1. A main board comprising:
   a multi-layer Printed Circuit Board (PCB) in which at least one recess is formed;
   a first integrated circuit placed in the recess;
   a second integrated circuit placed on the multi-layer PCB to cover the top of the recess and
   a molding that covers the first integrated circuit and the bottom of the recess, wherein a height of the molding is sized to cover the first integrated circuit and allow sufficient remaining space in the recess for the incorporation of an external device.

2. The main board of claim 1, wherein the multi-layer PCB comprises:
   at least one insulation layer; and
   conductive circuit pattern layers formed between the insulation layers.

3. The main board of claim 1, wherein the first integrated circuit is connected to a conductive circuit pattern layer formed in the bottom of the recess by a solder ball inserted between the first integrated circuit and the conductive circuit pattern layer.

4. The main board of claim 1, further comprising:
   a first interposer placed on the first integrated circuit; and
   a second interposer placed on the first interposer.

5. The main board of claim 1, wherein the molding includes an epoxy molding compound.

6. The main board of claim 1, further comprising at least one electronic device integrated on the multi-layer PCB.

7. A PC board comprising:
   a plurality of insulating layers;
   a patterned conductive layer embedded between at least two of said insulating layers;
   a recess, within said insulating layers, exposing a portion of said patterned conductive layer, the recess having a known height;
   a cover over said recess, wherein said cover is a second PC board;
   a plurality of via channels electrically connecting said patterned conductive layer to a top surface of said plurality of insulating layers; and
   an integrated circuit placed in said recess and electrically connected to said exposed patterned conductive layer, said integrated circuit being covered by a molding material, wherein a height of the molding material and the height of said recess is determined to allow a second device to be included in said recess.

* * * * *